(12) United States Patent
Chiu et al.

(10) Patent No.: US 7,382,056 B2
(45) Date of Patent: Jun. 3, 2008

(54) INTEGRATED PASSIVE DEVICES

(75) Inventors: Anthony M. Chiu, Richardson, TX (US); Yinon Degani, Highland Park, NJ (US); Charley Chunlei Gao, Plano, TX (US); Kunquan Sun, Plano, TX (US); Liquo Sun, Plano, TX (US)

(73) Assignee: Sychip Inc., Plano, TX (US)

( * ) Notice: Subject to any disclaimer, the term of this patent is extended or adjusted under 35 U.S.C. 154(b) by 393 days.

(21) Appl. No.: 11/030,754

(22) Filed: Jan. 6, 2005

(65) Prior Publication Data
US 2005/0253257 A1 Nov. 17, 2005

Related U.S. Application Data

(63) Continuation-in-part of application No. 10/835,338, filed on Apr. 29, 2004, now Pat. No. 7,259,077.

(51) Int. Cl.
*H01L 23/52* (2006.01)
(52) U.S. Cl. ............... 257/777; 257/701; 257/725; 257/E23.005
(58) Field of Classification Search ........... 257/725, 257/724, 701, 777, E23.005; 438/108, 109
See application file for complete search history.

(56) References Cited

U.S. PATENT DOCUMENTS

| | | | |
|---|---|---|---|
| 5,422,435 A * | 6/1995 | Takiar et al. ............... 174/521 |
| 6,291,880 B1 * | 9/2001 | Ogawa et al. ............... 257/723 |
| 7,132,747 B2 * | 11/2006 | Kwon et al. ............... 257/724 |
| 2002/0086500 A1 * | 7/2002 | Wu et al. ............... 438/455 |
| 2007/0013060 A1 * | 1/2007 | Kwon et al. ............... 257/725 |

* cited by examiner

*Primary Examiner*—Bradley W. Baumeister
*Assistant Examiner*—Steven J Fulk
(74) *Attorney, Agent, or Firm*—Peter V. D. Wilde

(57) ABSTRACT

The specification describes a multi-chip module (MCM) that contains an integrated passive device (IPD) as the carrier substrate (IPD MCM). Parasitic electrical interactions are controlled at one or both interfaces of the IPD either by eliminating metal from the interfaces, or by selective use of metal in parts of the MCM that are remote from the sensitive device components. The sensitive device components are primarily analog circuit components, especially RF inductor elements. In the IPD layout, the sensitive components are segregated from other components. This allows implementation of the selective metal approach. It also allows parasitic interactions on top of the IPD substrate to be reduced by selective placement of IC semiconductor chips and IC chip ground planes. In preferred embodiments of the IPD MCM of the invention, the IPD substrate is polysilicon, to further minimize RF interactions. The various methods of assembling the module may be adapted to keep the overall thickness within 1.0 mm.

20 Claims, 7 Drawing Sheets

INTEGRATED PASSIVE DEVICES

This application is a continuation-in-part of application Ser. No. 10/835,338, filed Apr. 29, 2004 now U.S. Pat. No. 7,259,077.

FIELD OF THE INVENTION

This invention relates to integrated passive devices (IPDs) and more specifically to integrated circuits (IC) in the form of multi-chip modules (MCMs) where an IPD chip is a main component.

BACKGROUND OF THE INVENTION (Portions of the technical material contained in this section may not be prior art.)

State of the art radio frequency (RF) electrical circuits use large quantities of passive devices. Many of these circuits are used in hand held wireless products. Accordingly, miniaturization of passive devices and passive device circuits is an important goal in RF device technology.

Integration and miniaturization of passive devices on the scale of active silicon devices has not occurred for at least two reasons. One, typical passive devices to date employ different material technologies. But, more fundamentally, the size of many passive devices is a function of the frequency of the device, and thus is inherently relatively large. However, still, there is unrelenting pressure to produce more compact and area efficient IPDs.

Significant advances have been achieved. In many cases these involve surface mount technology (SMT). Small substrates containing large numbers of passive components are routinely produced using surface mount technology.

More recent advances in producing integrated passive device networks involve thin film technology where resistors capacitors and inductors are built as integrated thin film devices on a suitable substrate. See for example U.S. Pat. No. 6,388,290. This advance shows promise as the next generation of integration in passive device technology. However, just as the substrate material and character (pure single crystal silicon) have been key to the success in active device technology, it is becoming evident that the same is true as IPD integration develops. Because passive thin film devices are formed directly on the substrate, electrical interactions between the substrate and the passive devices are of major concern. U.S. patent application Ser. No. 10/835,338 addresses these issues, and describes and claims an IPD substrate that offers processing advantages coupled with the desired dielectric properties. This substrate can also be made thin, to reduce the profile of the IPD.

While a common concern from a miniaturization standpoint is the so-called "footprint" of a device or circuit, reducing thickness is a companion goal. A common approach to reducing the footprint of ICs is to stack two or more chips in an MCM. In MCM technology, the thickness of the packaged chips is often as important as the footprint.

The MCM approach to miniaturization in RF circuits is often avoided due to the problem of RF interactions between components, especially inductor elements. The usual approach for RF circuits and IPDs is to spread the devices laterally on the substrate. Typically an IPD substrate is larger than a typical semiconductor IC, so to implement an MCM containing an IPD substrate, the IPD substrate is the logical candidate for the carrier substrate of the MCM, i.e. the semiconductor chips would be mounted on top of the IPD substrate. However, stacking devices on an IPD substrate especially invites problematic interactions. An IPD substrate in this MCM configuration faces two issues of RF field interactions, one with the substrate on which the IPD substrate is mounted, and another with the IC chips on the top of the IPD substrate.

SUMMARY OF THE INVENTION

We have developed an MCM that contains an IPD as the carrier substrate (IPD MCM). Parasitic electrical interactions are controlled at one or both interfaces either by eliminating metal from the interfaces, or by selective use of metal in parts of the MCM that are remote from the sensitive device components. The sensitive device components are primarily analog circuit components, especially RF inductor elements. In the IPD layout, the sensitive components are segregated from other components. This allows implementation of the selective metal approach. It also allows interactions on top of the IPD substrate to be reduced by selective placement of the IC semiconductor chips.

In preferred embodiments of the IPD MCM of the invention, the IPD substrate is the substrate described and claimed in the application referenced above. This substrate inherently reduces RF interactions, and can be made thin, to minimize the MCM profile.

DETAILED DESCRIPTION

The first part of the detailed description below deals with the preferred substrate for the IPD MCM.

Figure 1:
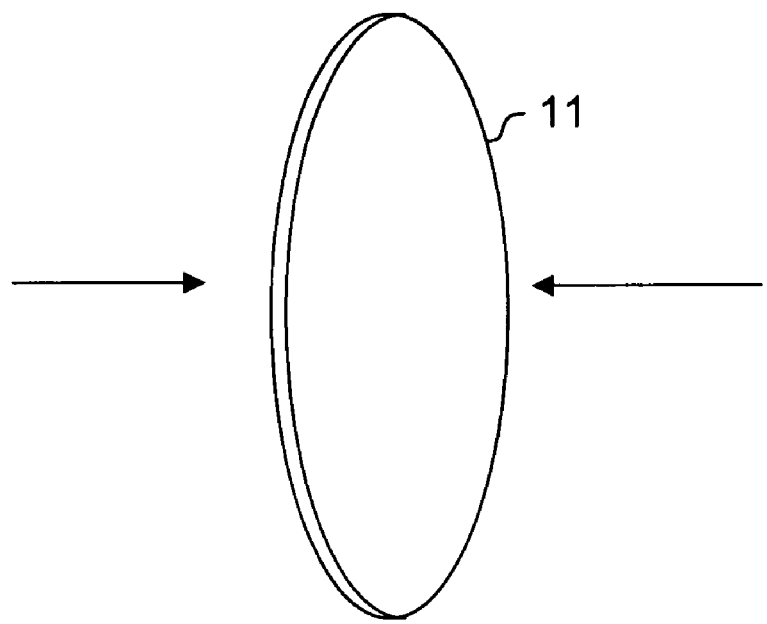
FIG. 1 shows a single crystal silicon starting wafer for preparing a high resistivity IPD substrate.

FIG. 1 is a view of a starting wafer 11. This is a single crystal silicon wafer cut from a boule, and is of a type of wafer used in enormous volume for IC device fabrication worldwide. Silicon wafers are produced in many sizes, but typically the larger the diameter of the wafer, the lower the potential device cost. Currently, silicon wafers are available in diameters up to twelve inches. With twelve inch wafers state of the art, that size will be used as the example in the following description, it being understood that smaller wafers, for example 6" or 8", are also useful.

In a wafer production facility, after sawing and polishing the wafers, each wafer is subjected to quality control, where the wafer is measured for conformity to rigid standards for physical size and electrical properties. Typically wafers with chips or scratches will be rejected. Wafers that have excessive or non-uniform conductivity are also rejected. In many cases the rejected wafers are scrapped, and sometimes referred to as "junk wafers". In this description, and in the claims that follow, a "refuse" wafer includes wafers that are cut from a boule, measured by one or more physical or electrical tests, and rejected for failing a test. Refuse wafers have relatively low commercial value. Some may be recycled. Some may be repaired. For example, some wafers are rejected for defects that occur during processing. These wafers have the potential to be polished to remove the defective structure, and used for processing. Such wafers are also defined as refuse wafers. A refuse wafer may be expected to have a value of less than 50%, and more typically, less than 10%, of the value of an acceptable wafer. A reclaimed wafer or recycled wafer is also an alternative source of low cost IPD substrate.

According to one aspect of the invention, a single crystal silicon wafer is used as a handle wafer to produce a polysilicon wafer. It should be understood that while a refuse wafer may be the wafer of choice for economic reasons, any suitable single crystal silicon wafer may be used. In this process, the single crystal wafer is sacrificial. As a handle wafer, the single crystal wafer has important attributes. Even though physically thin (e.g. 200-500 microns), it is relatively robust physically, and can be handled and processed. It is very flat over a large area. It has a highly polished uniformly smooth surface. And it is compatible with silicon wafer fabrication processes and tools.

Figure 2:
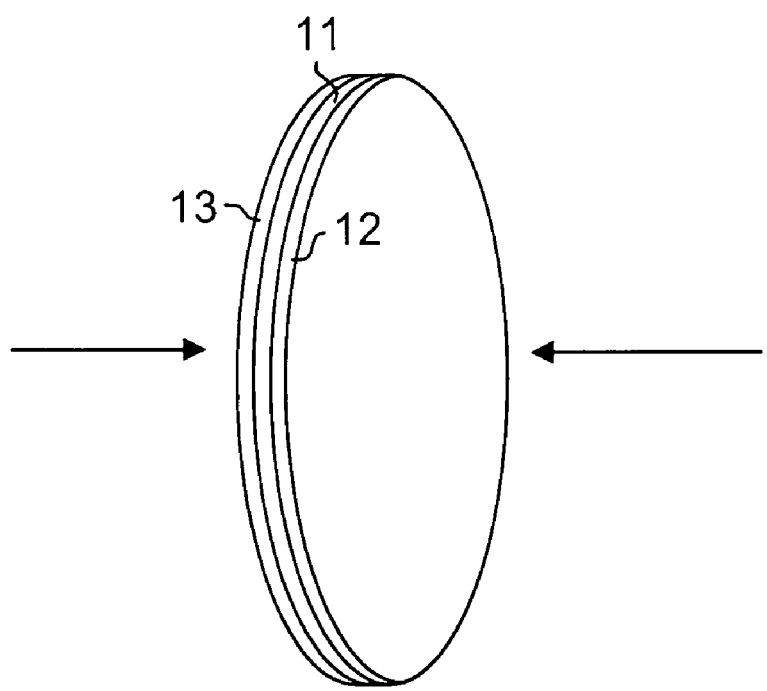
FIG. 2 shows the starting wafer with polysilicon deposited.

Using the silicon wafer as a substrate wafer, thick polysilicon layers 12 and 13 are deposited on both sides of wafer 11 as shown in FIG. 2. Alternatively, polysilicon may be deposited on one side only. However, the polysilicon layer destined for use as an IPD substrate needs to be relatively thick, for example at least 50 microns, and preferably 100-300 microns. We have found that layers with this thickness, when deposited on a single crystal substrate, contain high stress, and tend to physically distort. Since planarity is desirable for the IPD process of the invention, significant distortion of the substrate is preferably avoided. We have found that by depositing polysilicon on both sides of the single crystal wafer, stresses are equalized. Accordingly, layers preferably (but not necessarily) of equal thickness are formed as shown in FIG. 2. The resulting wafer is relatively thick, and very robust. To further reduce the stress in the composite wafer, the composite wafer may be annealed. However, care in annealing should be exercised, since annealing encourages grain growth, and fine grain structures are desired, for reasons that will become evident from the discussion below.

The subassembly of FIG. 2, i.e. a three-layer composite substrate, may be produced by a substrate manufacturer as a standalone product. A characteristic of that product, as well as the IPD substrates described above, is the planarity of the three layers in the composite.

The final substrate product desired is a polysilicon substrate, without the single crystal wafer, as will be described below. However, even though the composite wafer shown in FIG. 2 is riot the final product (i.e., the single crystal wafer will be absent in the final product), it is convenient to perform at least some of the processing on the composite wafer. The processed wafer may then be thinned in a later step to remove one of the polysilicon layers, and the single crystal layer, leaving the polysilicon layer to serve as the final IPD substrate.

An important attribute of an intrinsic polysilicon substrate is high resistivity. Polysilicon is characterized by a grain structure, wherein the layer or body is comprised of many grains of silicon, separated by grain boundaries. The grain boundaries behave electrically as recombination centers, drastically reducing the lifetime of free carriers in the body. In terms of electrical behavior, this characteristic separates polysilicon from single crystal silicon. While single crystal silicon is a semiconductor, the large number of grain boundaries in polysilicon make it, in an undoped or intrinsic state, an insulator. The resistivity of polysilicon is a partly a function of the number of grain boundaries, or the fineness of the grain structure. Thus very fine grain polysilicon may have very high resistivity. Polysilicon may easily be produced with a resistivity of more than 10 KOhm-cm. In the context of the invention, resistivity values of more than 0.1 KOhm-cm, and preferably more than 1 KOhm-cm are desired.

The method used to produce the polysilicon layers is preferably Low Pressure Chemical Vapor Deposition (LPCVD). This method, and CVD equipment for implementing the method, are widely used in industry. Briefly, the method commonly used for CVD polysilicon involves the pyrolysis of silane at modest temperatures, for example, 550-650° C. Polysilicon is used in nearly every MOS transistor made, and is thus one of the most common industrial materials known. Obviously, the electrical and physical properties of polysilicon are also well known. Though it is intrinsically highly resistive, as just described, it is typically processed by ion implantation to reduce the resistivity for IC applications. It is rarely used in its intrinsic form. Thick, wide-area, polysilicon layers have also been used in solar cells, or photocells. Here again, the polysilicon layers are typically implanted with ions to form diode structures.

In the application to be described below, the polysilicon substrate is used in its intrinsic state, and uniform high resistivity across the substrate is a desired property.

Since the technology of CVD polysilicon is so well developed, CVD is the preferred choice for forming the polysilicon layers 12 and 13. However, other methods may be found useful. For example, methods are known for e-beam evaporation of polysilicon. Any suitable alternative for forming a thick, wide area, low resistivity, polysilicon substrate layer is within the scope of the invention.

Figure 3:
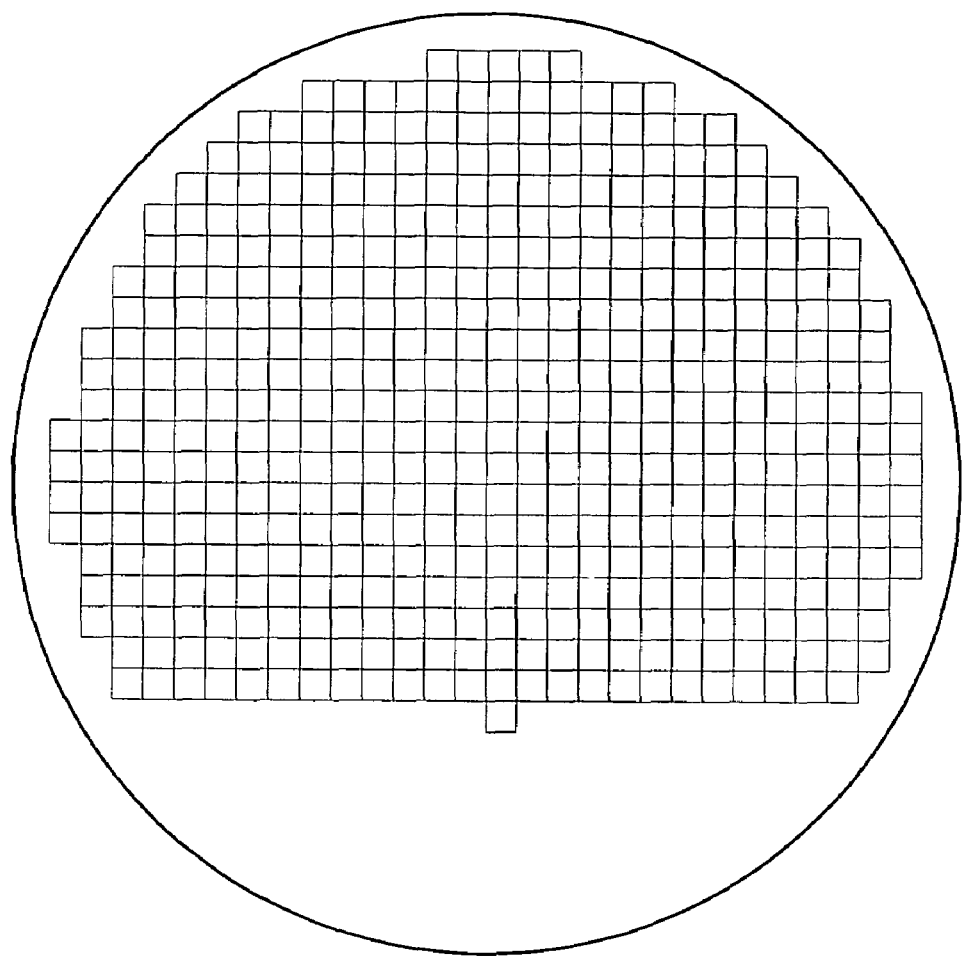
FIG. 3 is a view of the polysilicon wafer of the invention showing over 500 IPD sites for building thin film IPDs.

The IPD production approach described here is aimed at wafer scale device fabrication. In this approach, a large number of finished, or nearly finished, devices are produced on the polysilicon wafer. After fabrication is essentially complete, the wafer is diced into IPD chips. As the size of wafers increases, and IPD chip size shrinks, wafer level fabrication becomes ever more attractive. FIG. 3 shows a twelve inch wafer 31, which is capable of providing more than 500 device sites 33. (For simplicity, the wafer flat is not shown.) Each site is approximately a centimeter square, easily large enough to accommodate an IPD.

Figure 4:
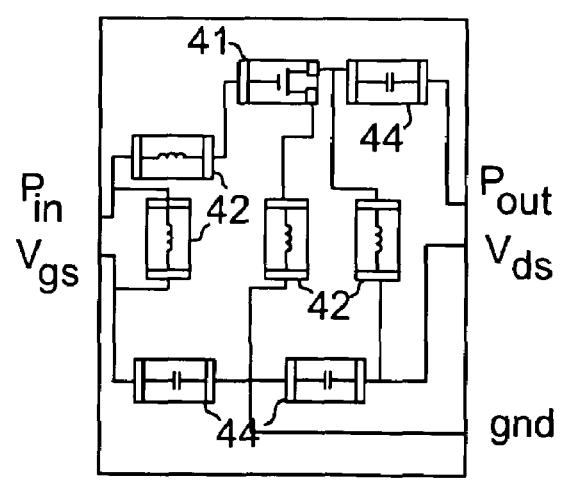
FIG. 4 is a schematic section view of a typical IPD showing conventional SMT components mounted on a conventional substrate.

The effectiveness of wafer scale fabrication can be multiplied using thin film fabrication approaches for forming the passive devices. A common prior art approach, even at the wafer level, is to mount and attach discrete passive elements to the wafer substrate. Typically this is done using surface mount technology (SMT). FIG. 4 shows this method as applied to the IPD circuit illustrated in FIG. 3 of U.S. Pat. No. 6,388,290, referenced earlier. This circuit is not strictly an IPD because it contains an active element, i.e. MOS transistor 41. However, for reasons that will become apparent below, it is a useful illustration. The circuit may be considered a hybrid circuit having an active portion and a passive portion. Here we will be concerned mainly with the passive portion, i.e. the portion that contains four inductors 42 and three capacitors 44. As a matter of choice, that portion could be produced as an IPD. Although the circuit of FIG. 3 is useful here, and below, as a vehicle to illustrate the technology of the invention, a wide variety of circuits may be made using the invention. For another example, and one that may be more demanding from a high-Q standpoint, see Proceedings 1994 IEEE MULTI-CHIP MODULE CONFERENCE MCMC-94, PAGES 15-19, incorporated herein by reference.

Thin film passive elements may be formed by a variety of thin film techniques. These techniques are well developed and the specifics need not be reiterated here. See for example U.S. Pat. No. 6,075,691, issued Jun. 13, 2000, and U.S. Pat. No. 6,005,197, issued Dec. 21, 1999. The latter patent describes a multi-layer structure for PCBs, which could easily be adapted for the application described here. A convenient way of defining a thin film passive device is a passive device that is formed on a substrate using one or more layers, typically a plurality of layers, deposited on the substrate.

Figure 5:
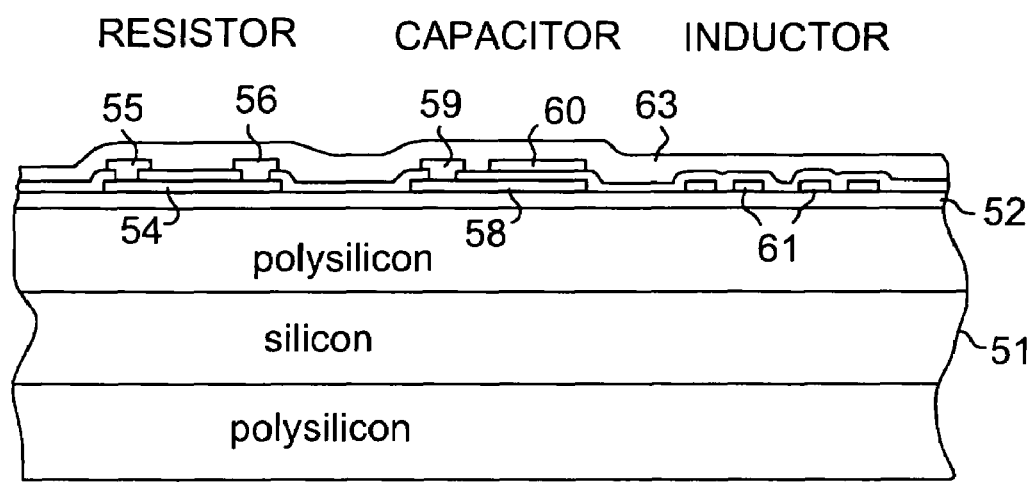
FIG. 5 is a schematic view of a thin film approach to IPD fabrication on one of the sites of the substrate of FIG. 3.

Thin film methods for producing single passive elements or combinations of interconnected passive elements are generically represented by FIG. 5, wherein the polysilicon substrate is shown at 51, with a grown oxide layer 52. Resistor body 54, formed from first level metal, has contacts 55 and 56, and lower capacitor plate 58, with contact 59, both comprise buried levels. Upper capacitor plate 60, and inductor spiral 61, are formed last, with contacts not shown. The structure is protected with polyimide layer 63.

Figure 6:
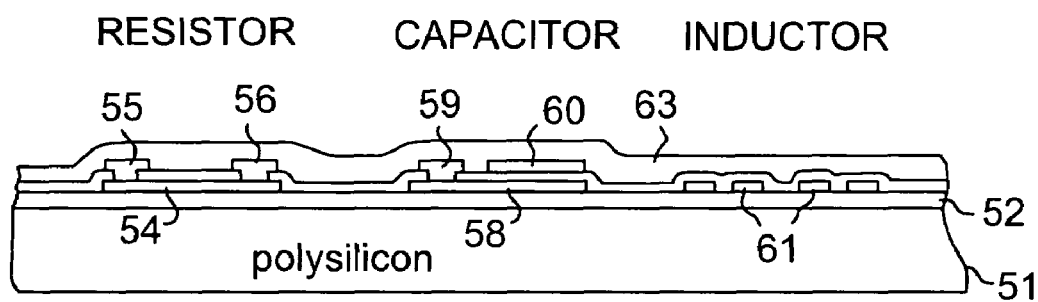
FIG. 6 is a view of the fabricated IPD after removal of the single crystal silicon handle.

The three-layer substrate structure 51 of FIG. 5 is very thick, which reduces the risk of fracture and other damage during processing. After fabrication of the passive circuit elements, and completion of the IPD, the substrate 51 is thinned to remove the lower polysilicon layer, and the single crystal silicon layer. The final IPD structure is shown in FIG. 6. The preferred thinning step uses chemical mechanical polishing. This well known process combines abrasive polishing with chemical etching. KOH or a suitable alternative etchant is used in the abrasive slurry. The composite wafer is thinned to where only the top polysilicon layer, or a portion of the top polysilicon layer, remains. Removing the entire single crystal layer is highly recommended, since that layer is relatively conductive. A goal of the invention is to provide a highly insulating substrate, which is a favorable platform for IPDs.

Because the single crystal layer (as well as the added polysilicon layer) provides an effective handle for the polysilicon top layer (the IPD layer), the IPD layer may be relatively thin initially. It is not uncommon in IC technology today to thin the starting wafer after wafer fabrication is complete. In many of these cases the substrate is deliberately made thick to survive handling and processing, with a thinning step later in the process to reduce the device profile. In the method described here, the thickness of the IPD layer may be initially the same approximate size as the final substrate thickness. That thickness is preferably 50-200 microns.

Figure 7:
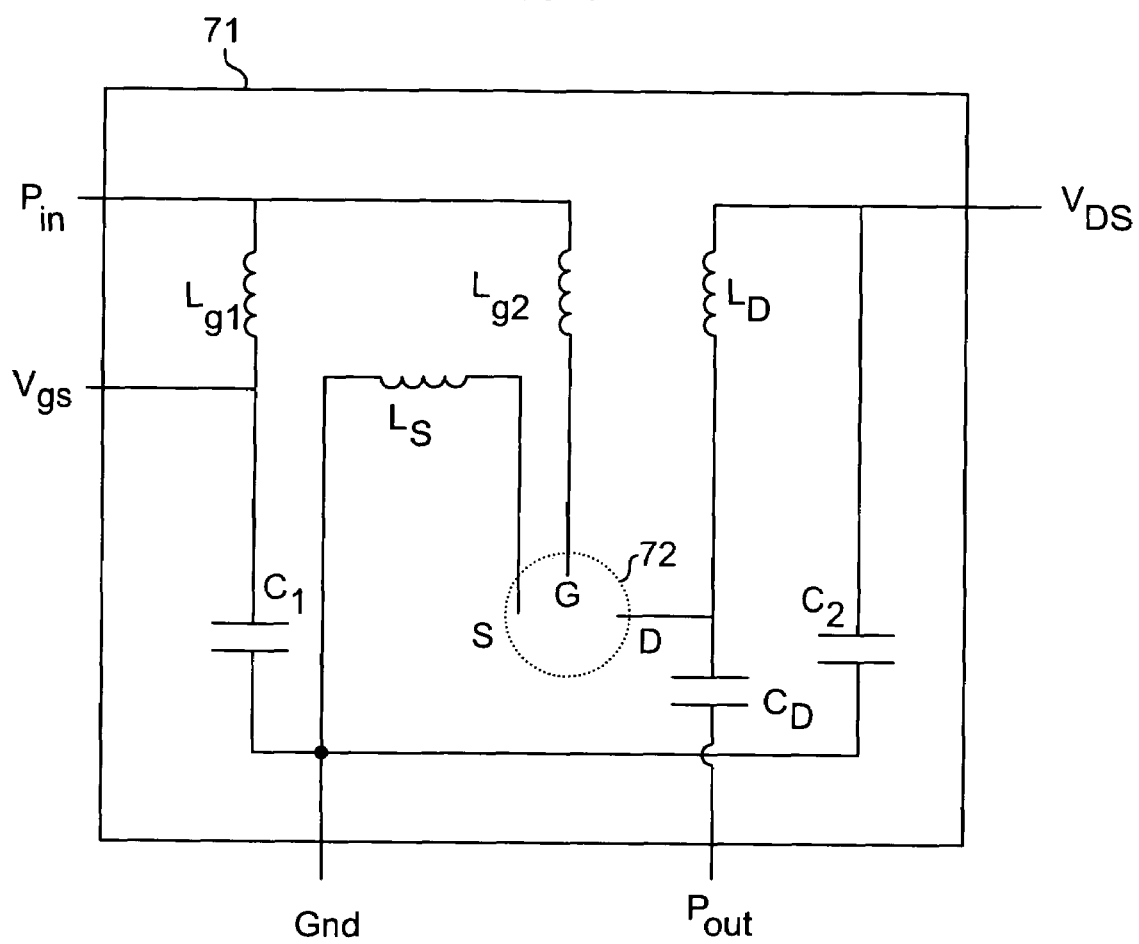
FIG. 7 is a schematic circuit diagram showing an example of an IPD.

The IPD of FIG. 4 is shown implemented according to one embodiment of the invention in FIG. 7. The IPD is formed on one or more of the sites 33 shown in FIG. 3. Polysilicon substrate 71 is shown with thin film inductors $L_{g1}$, $L_{g2}$, $L_S$ and $L_D$, and capacitors $C_1$, $C_2$, and $C_D$. MOS transistor 72 is shown in phantom because, while part of the schematic circuit, it is not formed in the IPD. The circuit layout for FIG. 7 is deliberately changed from that of FIG. 3. This circuit and this layout are for the purpose of illustrating a typical type of circuit having passive components. It is an example of a circuit taken from the prior art referenced earlier. No representation as to its effectiveness is made here.

Figure 8:
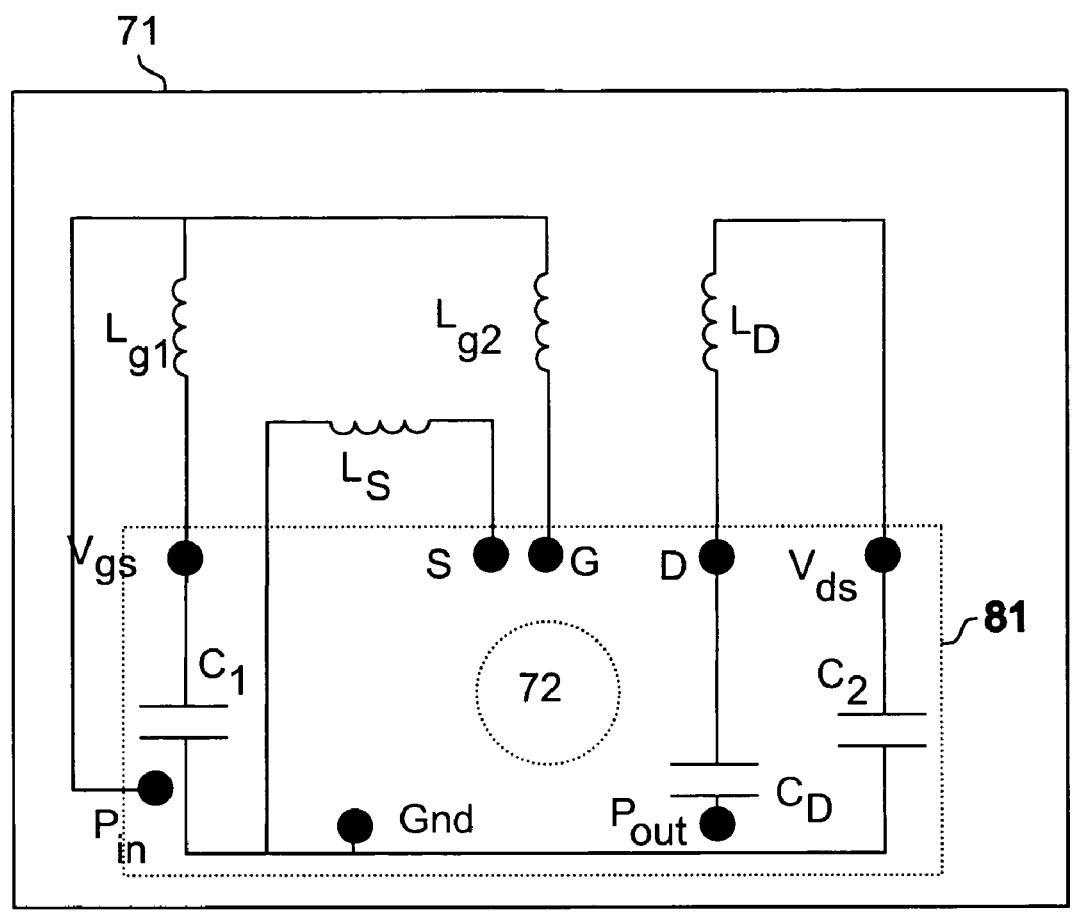
FIG. 8 shows the IPD with an active IC chip mounted on the IPD.

The layout in FIG. 7 is designed with all the inductor elements grouped together. It is known that inductor elements are especially sensitive to ambient conditions, e.g. parasitic signals. This recognition is employed in the design of the active/passive module shown in FIG. 8. The polysilicon substrate 71, with the IPD shown in FIG. 7, has an active IC chip 81 flip-chip mounted over the top of the IPD as shown. Part of the active IC chip is transistor 72. The interconnections in this embodiment are shown as solder bumps for the electrical interconnections S, D, G, $V_{gs}$, $V_{DS}$, $P_{in}$, $P_{out}$, gnd. Off board interconnection sites (not shown) may be provided on the IPD substrate 71. One purpose of the grouping of the inductor devices as shown in FIG. 7 is evident in FIG. 8. The active IC chip is deliberately positioned so as not to overlay the sensitive inductor elements. Thus the stacked substrate arrangement is effectively implemented to save space and provide a compact device module, without compromising the performance of the inductor elements.

Figure 9:
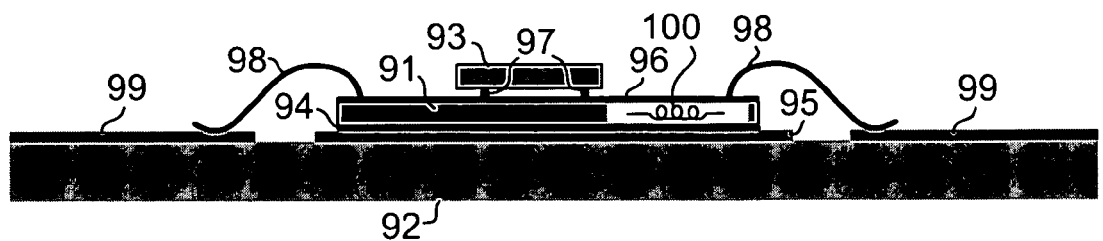
FIG. 9 shows another view of an MCM with an IPD carrier substrate and semiconductor IC chip.

FIG. 9 is another view of an IPD MCM, where IPD 91 is shown mounted on a printed circuit board (PCB) 92. An IC chip 93 is shown mounted on the IPD. For simplicity, only one IC chip is shown. Typically there will be more than one. These IC chips can be an analog device, digital device, mixed signal device, RF device, and/or a micro-electro-mechanical-system (MEMS) based switch or oscillator.

As will be evident from the discussion below, even if the sensitive RF components are segregated in the IPD as described above, other adverse issues remain to be addressed. These have to do with parasitic interactions between the sensitive elements in the IPD and external influences, mainly metal bodies, in the vicinity of the IPD. These adverse influences become more severe as the size, and primarily the thickness, of the IPD chip is reduced. This aspect of the invention cooperates with the expedients described above, it being an objective of the overall invention to shrink the thickness of the IPD MCM.

The conventional means for mounting the MCM to the PCB is solder. Referring again to FIG. 9, a solder bonding layer is shown at 94, with PCB ground plane at 95. The upper surface of the IPD is coated with a ground plane and metal runners for interconnecting the IC chip, typically placed on two levels. These are represented as layer 96 in the figure, and connect to the IC chip through solder bumps 97. The preferred solder connection is different from conventional flip chip connections in which the distance between the flip chip and substrate is kept at a maximum to maintain reliability, i.e. typically 70 to 120 um. The preferred solder connection has a small bump height, under 70 um, to accommodate the flatness variations between the IPD and the IC. Due to the similarity in thermal coefficient of expansion between the active IC and the IPD, there is no concern for solder joint reliability with a shortened distance. Furthermore, this reduction in distance will also contribute to the reduction of the overall thickness of the module. With this approach that thickness, including the overmolding, made be made small, for example, not exceeding 1.0 mm overall thickness. This reduction in the distance also reduces the parasitic resistance and inductance, to further improve the performance of the RF circuits. Besides solder, other commonly known methods, for example, gold-to-gold, gold-to-aluminum, and conductive adhesives, are also within this scope of this invention.

Wire bonds 98 connect the ground plane and runners to interconnections 99 on the PCB. Beside wire bonding, holes can be etched in the IPD, connecting the metal traces on the top and bottom surfaces of the IPD. This etching process is commonly practiced MEMS manufacturing process. The IPD with through holes is attached to the substrate by conventional flip chip assembly process. This through hole connection can further reduce the interconnect distance between the IPD and the substrate.

It is understood by those in the art that the assembly shown in FIG. 9, as well as that in other figures, is encapsulated in a polymer housing. The plastic housing may be a plastic overmolded body, as in most conventional devices, or may be a plastic cavity package or other suitable protective package.

It is evident that sensitive RF components, such as the inductor indicated schematically at 100, in an IPD with this MCM configuration, are vulnerable to stray capacitances due to the metal covering both surfaces of the IPD.

Figure 10:
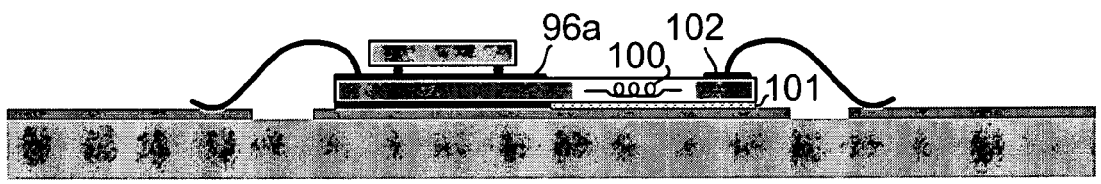
FIG. 10 shows an embodiment of an MCM with an IPD carrier substrate, a semiconductor IC chip selectively placed with respect to sensitive RF components, and metal removed from the lower IPD interface.

FIG. 10 shows an IPD MCM embodiment similar to that of FIG. 9 but with the metal both under and over the inductor 100 removed. It is understood that the inductor 100 represents a section of the IPD where one or more RF sensitive elements are selectively placed, and segregated from other, primarily digital, circuits and circuit components. Inductor components in the IPD may be associated in the same location on the IPD substrate as other components, as in an RF filter circuit. However, it is generally the inductor components in those circuits that are of concern from the standpoint of parasitic electric fields.

The metal underneath the IPD, shown at 94 in FIG. 9, remains under one portion of the IPD, but has been removed at 101 from underneath the portion of the IPD containing sensitive element 100. The metal under that portion of the IPD is replaced with a non-conducting adhesive attachment layer. The non-conducting adhesive is preferably an electrically insulating thermally conducting die attach material such as an alumina filled epoxy.

In addition, the metal on the top of the IPD, shown at 96 in FIG. 9, has been removed from the area overlying the sensitive elements of the IPD, e.g. element 100. The metal remains at 96a, over the digital elements in the IPD. The wire bond is made to contact pad 102. In the embodiment shown the metal layers 96 and 96a are intended as presenting the ground plane, typically a continuous sheet of metal. Some amounts of metal runners used for connecting to solder bumps on the IC may be tolerated over the sensitive elements of the IPD. Accordingly, one of more IC chips may be mounted over these regions. However, a ground plane in these regions is to be avoided. Preferably, the layout is designed with no metal extending along the surface over the sensitive elements.

It should be pointed out that either, or both, of these expedients will improve the electrical performance of the IPD MCM.

Figure 11:
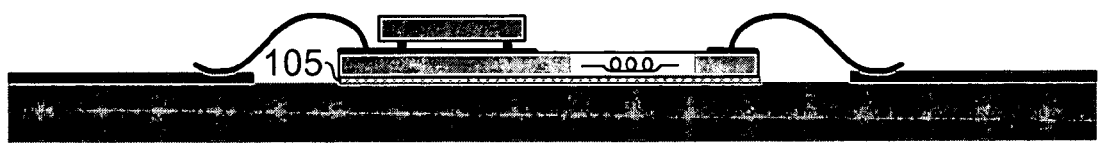
FIG. 11 shows an alternative embodiment of an MCM with an IPD carrier substrate.

FIG. 11 shows an embodiment, similar to that of FIG. 10, with the entire metal layer between the IPD and the PCB removed, and replaced with non-conducting adhesive layer 105. Since the ground plane underneath the IPD is no longer used, the metal ground plane layer, shown at 95 in FIG. 9, is also removed. The resulting structure is a substrate with an IPD attached to the substrate with a non-conducting attachment layer, the IPD having a first portion containing mainly RF components and a second portion containing mainly non-RF components, the IPD having a first surface over the first portion and a second surface under the first portion, at least one digital IC chip mounted on the second portion of the IPD, with the first and second surfaces of the IPD devoid of metal. The portion of the IPD that does not contain RF sensitive devices may also be adapted to support a MEMS device, for example, a MEMS oscillator or a MEMS switch.

Close inspection of the embodiment of FIG. 11 will reveal that the elimination of the metal layer from the PCB allows the overall height of the IPD MCM to be reduced by the thickness of that layer. While that may appear to be a minor change, it can be significant from a commercial standpoint. A commercial IPD MCM has been demonstrated with a design similar to that shown in FIG. 11, having an overall package height from the bottom of the PCB to the top of the encapsulant, of 1.000 mm. This device is expected to be commercially competitive due in part to the small profile.

Figure 12:
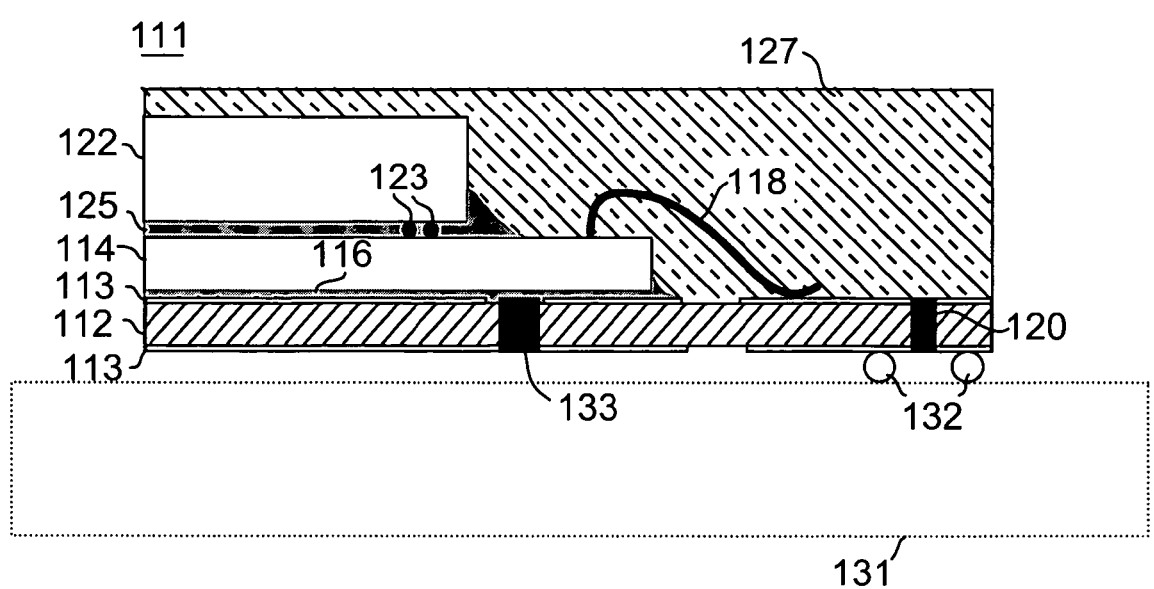
FIG. 12 is a section view of a fully assembled IPD MCM product.

FIG. 12 shows a section view of a fully assembled IPD MCM product shown generally at 111. PCB 112 is provided with metallization 113 on portions of both the top and bottom. The IPD is shown at 114 and is attached to the PCB by the die attach material 116, using one of the options described above. The IPD is electrically interconnected to the PCB with wire bonds, one of which is shown at 118. The wire is bonded to the top layer of the PCB. Metal via 120 through connects the metal on the top of the PCB with the metal on the bottom. The IPD MCM may then be easily mounted and connected to a system substrate. An IC chip 122 is shown flip-chip attached to IPD 114. Solder bumps 123 attach and connect the IC chip to metal runners on the IPD. The IC chip may be a digital or RF IC chip. It is usual to provide a ground plane for the IC chips. However, according to the principles set forth above, a ground plane is deliberately absent from the regions of the IPD that overlie inductor elements. In the preferred case, if IC chips are located over the inductor elements, the ground plane is omitted from this region. Also, the I/O interconnections for that IC chip are preferably but not necessarily located near an edge of the IC chip that is not over any inductor elements.

In areas of the PCB with a ground plane directly under an active IC, one or more thermal vias may be placed between the top and bottom metal planes of the PCB to remove heat generated by the IPD MCM during operation. The heat generated by the active IC will pass from the IC onto the IPD, to the alumina filled die attach, to the top ground plane, to the thermal vias (133), to the bottom ground plane, and get dissipated by the system board on which the IPD MCM is mounted. This is a departure from conventional practice where the ground plane is a continuous plane, spreading out under the IC. However, due to the need to accommodate the inductor elements in the IPD, there is no metal plane under certain RF elements. Therefore, this ground plane may be non-continuous, and can be broken into small pieces that can be strategically placed under the heat generating ICs.

Passive components, for example, capacitors, inductors and resistors, that are too large to be implemented in IPD can be mounted on the substrate using a conventional surface mount process.

The final part of the assembly is the provision of a protective housing for the IPD MCM. FIG. 12 shows an encapsulant 127, a common protective element that consists of a polymer, usually molded over the electrical assembly.

Alternatively, the protective housing may be a metal can, a plastic cavity, or any suitable protective housing. These are well known in the art.

Besides providing miniaturized passive components, the IPD also serves as a technology bridge between IC fabrication process and PCB fabrication process. The leading edge ICs can be fabricated in feature sizes ranging from 1 um to 0.065 microns (um), using connecting pads ranging in pitch from 30 to 300 um. The IPD is fabricated in less advanced IC tools, for example, thin film sputtering and etch, with feature sizes of 1 to 20 um. These IPD features can seamlessly accommodate the smallest pitch IC connection pads. Conversely, the PCBs lines and traces are fabricated in 10 s of um, using plating and etching technology, it can typically accommodate large pitch connection pads, ranging from 60 to 300 um. An IC, with large connecting pad pitch will be larger in surface area than an IC with smaller connecting pad pitch. It is very common that the connection pads of an IC is the driving factor of the overall size of the IC and not the number of gates or cells. Therefore, the cost of an IC, which is directly proportional to the surface area, will go up if it is to connect directly to a PCB substrate with gross feature sizes, However, with the IPD, which has much finer feature size than the PCB and lower cost per unit area than an IC because of its much simpler fabrication steps, it is a cost effective way to bridge the fine feature capability of the IC and the gross feature capability of the PCBs. Therefore, the IPD acts as a cost effective mechanical interface between the IC and the substrate. One aspect of this can be seen schematically in FIG. 12, where the IPD MCM is shown attached to a system level board 131 with solder balls 132. Comparing the pitch of solder balls 132 with the pitch of solder bumps 123 illustrates the transition just described. The overall height of this package is small, as described above, less than 1.2 mm, and preferably 1.0 mm or less, from the bottom plane of PCB 112 to the top of the encasement or overmold 127.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. An integrated passive device multichip module (MCM IPD) comprising:
   a. a substrate,
   b. an IPD attached to the substrate with an attachment layer, wherein at least part of the attachment layer is non-conducting,
   and wherein the IPD comprises a first portion containing at least one inductor component and a second portion containing at least one digital component and wherein the part of the attachment layer underneath the first portion of the IPD is non-conducting and the part of the attachment layer underneath the digital components is conducting.

2. The IPD MCM of claim 1 wherein the entire attachment layer is non-conducting.

3. The IPD MCM of claim 2 wherein there is no metal between the IPD and the substrate.

4. The IPD MCM of claim 1 wherein the IPD MCM further includes at least one integrated circuit (IC) chip mounted on the top of the IPD.

5. The IPD MCM of claim 1 wherein the top of the IPD is selectively covered with a ground plane.

6. The IPD MCM of claim 5 wherein the ground plane is selectively placed only on the second portion of the IPD.

7. The IPD MCM of claim 1 wherein the non-conducting portion of the attachment layer is electrically insulating thermally conducting die attach material.

8. The IPD MCM of claim 7 wherein the non-conducting portion of the attachment layer is alumina filled epoxy.

9. The IPD MCM of claim 1 wherein the IPD comprises a polysilicon wafer substrate with at least one thin film passive device on the polysilicon wafer.

10. The IPD MCM of claim 9 wherein the polysilicon wafer substrate has a resistivity of more than 0.1 KOhm-cm.

11. An integrated passive device multichip module (MCM IPD) comprising:
    a. a substrate,
    b. an IPD attached to the substrate with an attachment layer, at least a portion of which is non-conducting, the IPD comprising a first portion containing mainly RF components and a second portion containing mainly non-RF components, the IPD having a first surface over the first portion and a second surface under the first portion,
    c. an IC chip mounted on the second portion of the IPD, the MCM IPD characterized in that the first and second surfaces of the IPD are devoid of metal.

12. The IPD MCM of claim 11 wherein the IPD comprises a polysilicon wafer substrate with at least one thin film passive device on the polysilicon wafer.

13. The IPD MCM of claim 12 wherein the polysilicon wafer substrate has a resistivity of more than 0.1 KOhm-cm.

14. The IPD MCM of claim 11 further including a MEMS device.

15. The IPD MCM of claim 11 further including a protective body covering the IPD MCM.

16. The IPD MCM of claim 15 wherein the overall thickness of the IPD MCM measured including the thickness of the IPD, the thickness of the IC chip and the thickness of the protective body, is less than 1.2 mm.

17. The IPD MCM of claim 16 wherein the overall thickness of the IPD MCM measured including the thickness of the IPD, the thickness of the IC chip and the thickness of the protective body, is less than 1.0 mm or less.

18. The IPD MCM of claim 15 wherein the IC chip is attached to the IPD with wire bonds.

19. The IPD of claim 15 wherein the IPD is a technology transition interface between the IC chip and the PCB.

20. The IPD MCM of claim 19 wherein the IC chip is attached to the IPD with solder bumps having a first pitch, the IPD is attached to a PCB, and the PCB is attached to a system support substrate with solder bumps having a second pitch, wherein the first pitch is significantly smaller than the second pitch.

* * * * *